United States Patent
Kozyrev

(10) Patent No.: US 12,074,594 B2
(45) Date of Patent: Aug. 27, 2024

(54) GENERATION AND SHAPING OF ELECTROMAGNETIC PULSES USING TIME-VARYING TRANSMISSION LINES

(71) Applicant: Rockwell Collins, Inc., Cedar Rapids, IA (US)

(72) Inventor: Alexander B. Kozyrev, Iowa City, IA (US)

(73) Assignee: Rockwell Coll ins, Inc., Cedar Rapids, IA (US)

( * ) Notice: Subject to any disclaimer, the term of this patent is extended or adjusted under 35 U.S.C. 154(b) by 168 days.

(21) Appl. No.: 17/735,796

(22) Filed: May 3, 2022

(65) Prior Publication Data

US 2023/0361774 A1 Nov. 9, 2023

(51) Int. Cl.
*H03K 17/00* (2006.01)
*H03K 17/78* (2006.01)

(52) U.S. Cl.
CPC ........... *H03K 17/78* (2013.01); *H03K 17/002* (2013.01)

(58) Field of Classification Search
CPC .... H03K 17/002; H03K 17/785; H03K 17/78; H03K 17/10; H03K 17/687; H03K 17/693; H03K 5/05; H03K 5/04; H03K 5/023; H03K 5/02; H03K 5/01
See application file for complete search history.

(56) References Cited

U.S. PATENT DOCUMENTS

| | | | |
|---|---|---|---|
| 5,293,527 A | 3/1994 | Sutton et al. | |
| 5,789,994 A * | 8/1998 | Case | H03K 5/159 |
| | | | 327/181 |
| 6,097,329 A * | 8/2000 | Wakayama | G01S 13/951 |
| | | | 342/159 |
| 6,556,089 B2 * | 4/2003 | Wood | H03K 3/86 |
| | | | 331/55 |
| 7,844,241 B2 * | 11/2010 | Kintis | H04B 1/28 |
| | | | 455/313 |
| 7,884,504 B2 | 2/2011 | Tao et al. | |
| 8,081,035 B2 * | 12/2011 | Wood | H03B 5/1852 |
| | | | 331/177 V |
| 8,744,004 B2 * | 6/2014 | London | H03K 5/12 |
| | | | 375/299 |
| 9,391,596 B2 | 7/2016 | Campbell | |
| 9,900,203 B1 | 2/2018 | London et al. | |
| 9,935,218 B2 | 4/2018 | Kozyrev et al. | |
| 10,962,335 B2 | 3/2021 | Holihan et al. | |
| 2007/0273454 A1 * | 11/2007 | Pepper | H03B 19/05 |
| | | | 333/132 |
| 2008/0054985 A1 * | 3/2008 | Tsai | H03K 17/002 |
| | | | 327/427 |
| 2011/0235742 A1 * | 9/2011 | London | H04K 3/62 |
| | | | 375/295 |

(Continued)

*Primary Examiner* — John R Lee
(74) *Attorney, Agent, or Firm* — Suiter Swantz IP

(57) ABSTRACT

A staged circuit includes a plurality of switching elements in series. Each of the switching elements includes two switches operated in concert. Separate but correlated clock signals drive the switches of each switching element. Switch timing for the switches in each switching element is tuned via certain delays to produce transients with variable characteristics. Furthermore, the number of switching elements may be adjusted to produce transients with variable characteristics. The staged circuit defines a time-varying transmission line and can be used as a driver for a NLTL source.

20 Claims, 7 Drawing Sheets

(56) References Cited

U.S. PATENT DOCUMENTS

2016/0197215 A1* 7/2016 Kozyrev ................ H01L 31/08
  250/214 SW
2023/0361774 A1* 11/2023 Kozyrev .............. H03K 17/002

* cited by examiner

| $t_{sw}$ | $f_L$ | $f_H$ | $b_t$ | pbw |
|---|---|---|---|---|
| 1.875 ns | 278 MHz | 919 MHz | 3.31 | 107% |
| 3.75 ns | 15 MHz | 832 MHz | 55.47 | 193% |
| 7.5 ns | 12 | 398 MHz | 33.17 | 188% |
| 11.25 ns | 10 | 238 MHz | 23.8 | 184% |

| $t_{sw}$ | $f_L$ | $f_H$ | $B_r$ | pbw |
|---|---|---|---|---|
| 1.875 ns | 476 MHz | 540 MHz | 1.79 | 56.63% |
| 3.75 ns | 339 MHz | 612 MHz | 1.8 | 57.14% |
| 7.5 ns | 129 | 473 MHz | 3.67 | 114.35% |
| 11.25 ns | 82 | 291 MHz | 3.55 | 112.1% |

| $t_{sw}$ | $f_L$ | $f_H$ | $B_r$ | pbw |
|---|---|---|---|---|
| 1.875 ns | 702 MHz | 822 MHz | 1.17 | 15.67% |
| 3.75 ns | 406 MHz | 798 MHz | 1.97 | 65.32% |
| 7.5 ns | 439 | 639 MHz | 1.46 | 37.4% |
| 11.25 ns | 83 | 301 MHz | 3.63 | 113.6% |

GENERATION AND SHAPING OF ELECTROMAGNETIC PULSES USING TIME-VARYING TRANSMISSION LINES

BACKGROUND

Electrically sourced electromagnetic pulse (EMP) systems use technologies such as high voltage pressurized spark gaps, arrays of photoconductive semiconductor switches, fast semiconductor switches, and pulse compression using nonlinear transmission lines (NLTLs). While these technologies can generate radiated electric field strengths sufficient to produce effects on electronics (up to tens of kilovolts per meter), they are challenged by system size and weight requirements and the need for wall-plug power. Furthermore, such systems require application specific devices and components, such as switches, which are hard to manufacture in significant quantities, limiting adoption of the technology to expensive point solutions. Also, existing EMP systems are generally not tunable after they are built.

High voltage pressurized spark gaps typically require voltages greater than 100 kV and have limited life cycles. Arrays of photoconductive switches require bulky and inefficient laser subsystem to trigger switching. Silicon photoconductive switches require thicker than typical commercial wafers so they must be processed at outdated foundries.

It would be advantageous to have an EMP system with off-the-shelf components, tunable to specific characteristics.

SUMMARY

In one aspect, embodiments of the inventive concepts disclosed herein are directed to a staged circuit with a plurality of switching elements in series. Each of the switching elements includes two switches operated in concert. Separate but correlated clock signals drive the switches of each switching element.

In a further aspect, switch timing for the switches in each switching element is tuned via certain delays to produce transients with variable characteristics. Furthermore, the number of switching elements may be adjusted to produce transients with variable characteristics.

In a further aspect, the staged circuit defines a time-varying transmission line and can be used as a driver for a NLTL source.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
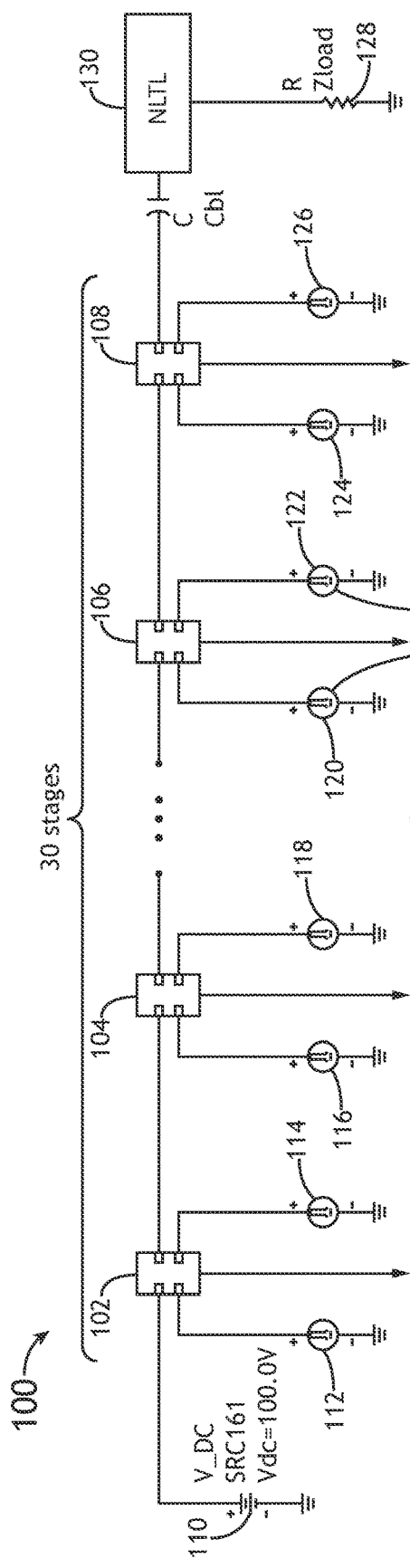
FIG. 1 shows a block diagram of an EMP source circuit according to an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement. Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a staged circuit with a plurality of switching elements in series. Each of the switching elements includes two switches operated in concert. Separate but correlated clock signals drive the switches of each switching element. Switch timing for the switches in each switching element is tuned via certain delays to produce transients with variable characteristics. Furthermore, the number of switching elements may be adjusted to produce transients with variable characteristics. The staged circuit defines a time-varying transmission line and can be used as a driver for a NLTL source.

Referring to FIG. 1, a block diagram of an EMP source circuit 100 according to an exemplary embodiment is shown. The EMP source circuit 100 comprises a plurality of staged switching elements 102, 104, 106, 108. A charge source or DC voltage supply 110 feeds a first switching element 102. Trigger signals 112, 114, 116, 118, 120, 122, 124, 126 control switches within each staged switching element 102, 104, 106, 108. A final staged switching element 108 is connected a load 128 that may utilize the EMP generated by the EMP source circuit 100. In at least one embodiment, thirty or more switching elements 102, 104, 106, 108 may be staged together; more stages may enable faster waveform. However, there may be a diminishing return when adding additional stages defined by the desired characteristics of the transient.

In at least one embodiment, the trigger signals 112, 114, 116, 118, 120, 122, 124, 126 comprise a first set of trigger signals 112, 116, 120, 124 and a second set of trigger signals 114, 118, 122, 126, each configured to operate separate switches within corresponding switching elements 102, 104, 106, 108. For example, a first trigger signal 112 and second trigger signal 114 are configured to control separate switches within the first switching element 102, while simultaneously, a third trigger signal 116 and fourth trigger signal 118 are configured to control separate switches within a second switching element 104.

The first set of trigger signals 112, 116, 120, 124 may be operated in a synchronized manner; likewise, first second of trigger signals 114, 118, 122, 126 may also be operated in a synchronized manner. Alternatively, the first set of trigger signals 112, 116, 120, 124 may be a single clock signal distributed to each switching elements 102, 104, 106, 108, and the second set of trigger signals 114, 118, 122, 126 may also be a single clock signal. In either embodiment, the first set of trigger signals 112, 116, 120, 124 operate synchronously with each other and the second set of trigger signals 114, 118, 122, 126 also operate synchronously with each other, but potentially asynchronously with the first set of trigger signals 112, 116, 120, 124.

In at least one embodiment, the EMP source circuit 100 may be operated as, or as a component of, a NTLT source 130. Unlike conventional NLTLs, the EMP source circuit 100 does not require any input, drive signal; only the DC voltage supply 110 and the trigger signals 112, 114, 116, 118, 120, 122, 124, 126. Furthermore, the EMP source circuit 100 does not require sub-nanosecond switching components to produce 200 MHz-1000 MHz EMP pulses. Nonideal switching in SiC MOSFET or GaN FET, with 2 ns to 15 ns switching time, and a travelling discharge front provide necessary risetime conditioning and pulse sharpening within the transmission line.

Figure 2:
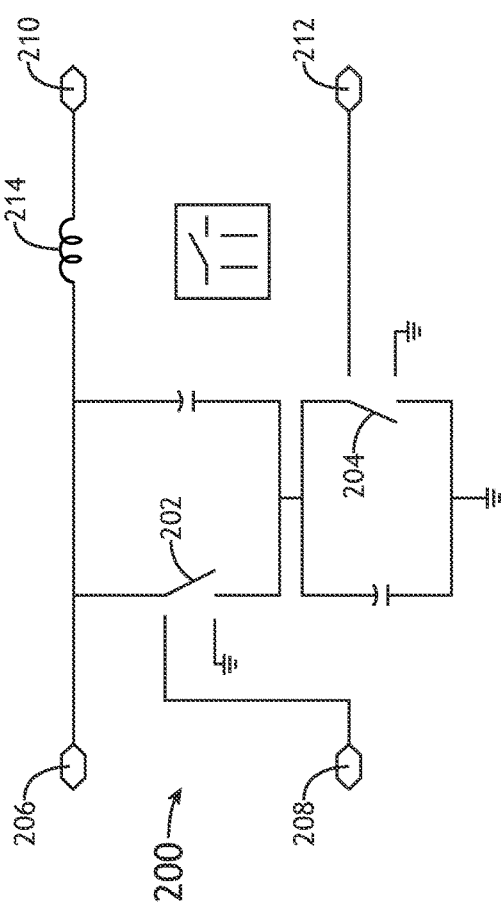
FIG. 2 shows a block diagram of a switching element circuit according to an exemplary embodiment.

Referring to FIG. 2, a block diagram of an elementary stage 200 of a time-varying transmission line according to an exemplary embodiment is shown. Each stage 200 consists of a series inductor 214 and shunt switching element circuit including. The shunt switching element circuit includes a first switch 202 controlled by a first trigger input 208, and a second switch 204 controlled by a second trigger input 212. The first switch 202 and second switch 204 are connected in series and may be electronically identical.

An input terminal 206 of a first stage receives a DC voltage input; subsequent stages receive a RF input. A linear inductor 214 and the first switch 202 and second switch 204 are arranged to produce a pulse at an output terminal 210. Each switch's 202, 204 output capacitance is combined to define the transmission line capacitance. The resistance of each switch 202, 204 changes from a low-ohm, "on" state to high-ohm, "off" state and back.

In at least one embodiment, the switches 202, 204 are triggered simultaneously but out of phase such that one of the switches 202, 204 always remains "on", for example, when the first switch 202 is "on" the second switch 204 is "off" and vice versa. It may be appreciated that the synchronized states of the switches 202, 204 is a function of trigger signals received via the first trigger input 208 and second trigger input 212 respectively. To generate a single pulse, each switch 202, 204 is turned "on" and "off" as controlled by corresponding trigger signals. The switches 202, 204, in series, are used to control peak current. Charging voltage and parameters of the triggering waveforms are chosen such that a maximum current in any of the switches 202, 204 at any time does not exceed some maximum rating, such as 600 A.

Figure 3:
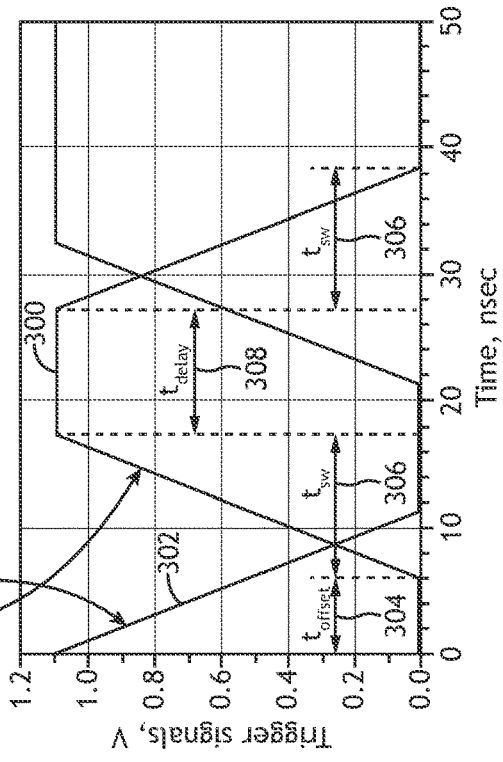
FIG. 3 shows a graph of switch timing events according to an exemplary embodiment.

Referring to FIG. 3, a graph of switch timing events in each elementary stage of the time-varying transmission line according to an exemplary embodiment is shown. A first trigger signal 300 and second trigger signal 302 control the switching of a plurality of switching elements in an EMP source circuit. The characteristics of the resulting EMP may be defined by certain waveform characteristics of the trigger signals 300, 302. Triggering signal waveforms are characterized by switching time $t_{sw}$ 306 (time required to turn the switch "on" or "off"), an offset between triggering the first switch and second switch in each switching element $t_{offset}$ 304, and a delay between turning each switch "on" and "off" $t_{delay}$ 308. For a fixed EMP source circuit design, the characteristics of the triggering signal waveforms define the pulse waveform shape and its spectral content. Periodic triggering signals 300, 302 will enable periodic generation of EMP pulses with a certain repetition rate.

Figure 4:
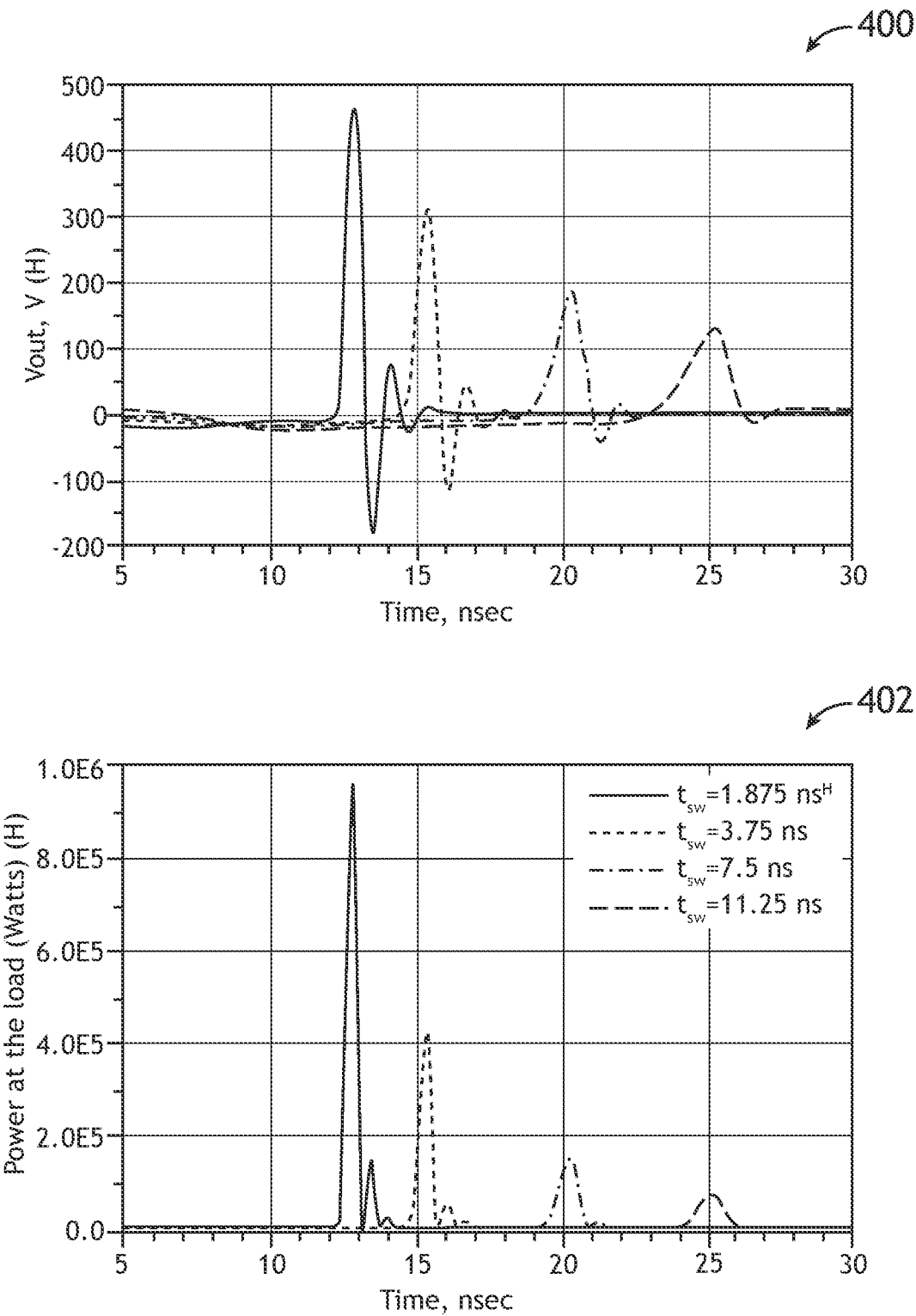
FIG. 4 shows graphs of waveforms for different switching times according to exemplary embodiments.
Figure 4:
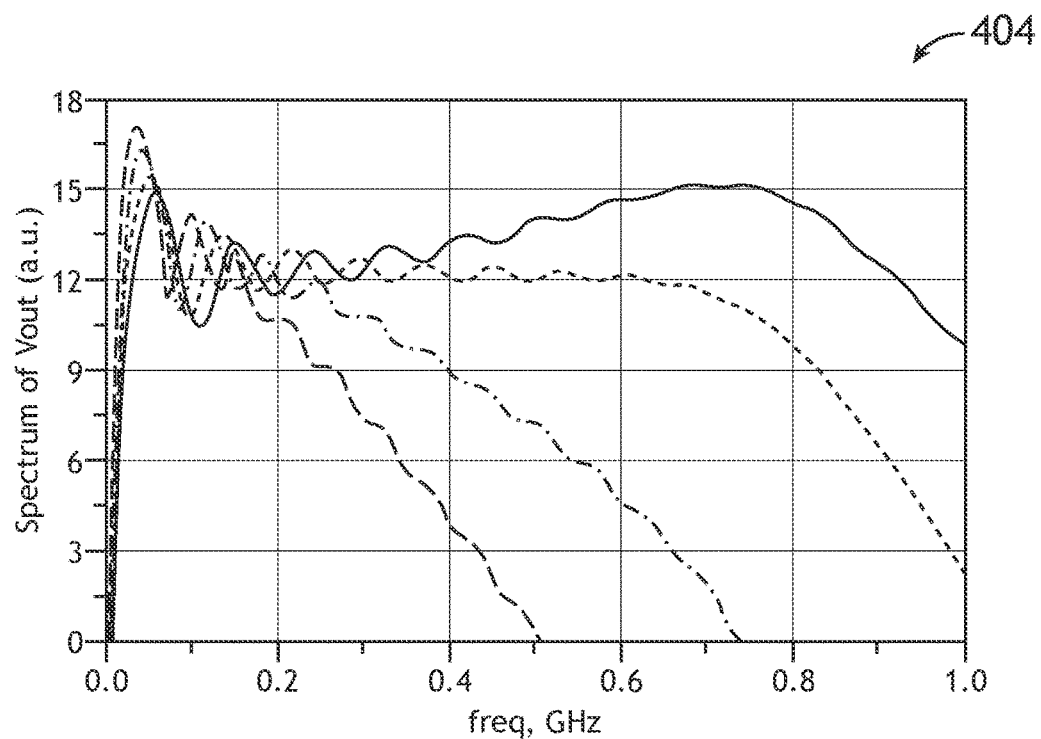

Referring to FIG. 4, graphs of waveforms for different switching times according to exemplary embodiments is shown. EMP devices use high-power electromagnetic energy to produce temporary or permanent effects on electronics. Sufficiently intense pulses of electromagnetic radiation in the 200 MHz to 5 GHz frequency range have demonstrated disruption or damage to electronic systems. EMP devices can produce moderate-band radiation in the range of 1%≤pbw<100%, where the percent bandwidth (pbw) is defined as $$pbw = 200\frac{br-1}{br+1}\%$$

The band ratio, br equals $$\frac{f_H}{f_L},$$

where $f_H$ and $f_L$ are the highest and lowest frequencies, respectively. Broad frequency content is an advantage as it increases the probability of effective coupling into a wide variety of potential targets.

Various aspects of EMP waveforms at the load, and their spectra, are shown 400, 402, 404 when first and second switches in each switching element stage are triggered simultaneously. In at least one embodiment, as shown, there may be a 10 ns delay between turning each switch "on" and "off". Different waveforms correspond to different switching times. In this case it is possible to obtain hyperband pulses (br>10) converting the spectrum range up to 900 MHz. In at least one embodiment, predicted instantaneous power 402 may approach 1 MW for the fastest switching time at 2 ns.

In at least one embodiment, the shape of an EMP waveform and its spectrum 404 content by varying the offset between triggering a first switch and second switch $t_{offset}$ and the delay between turning each switch "on" and "off".

Figure 5:
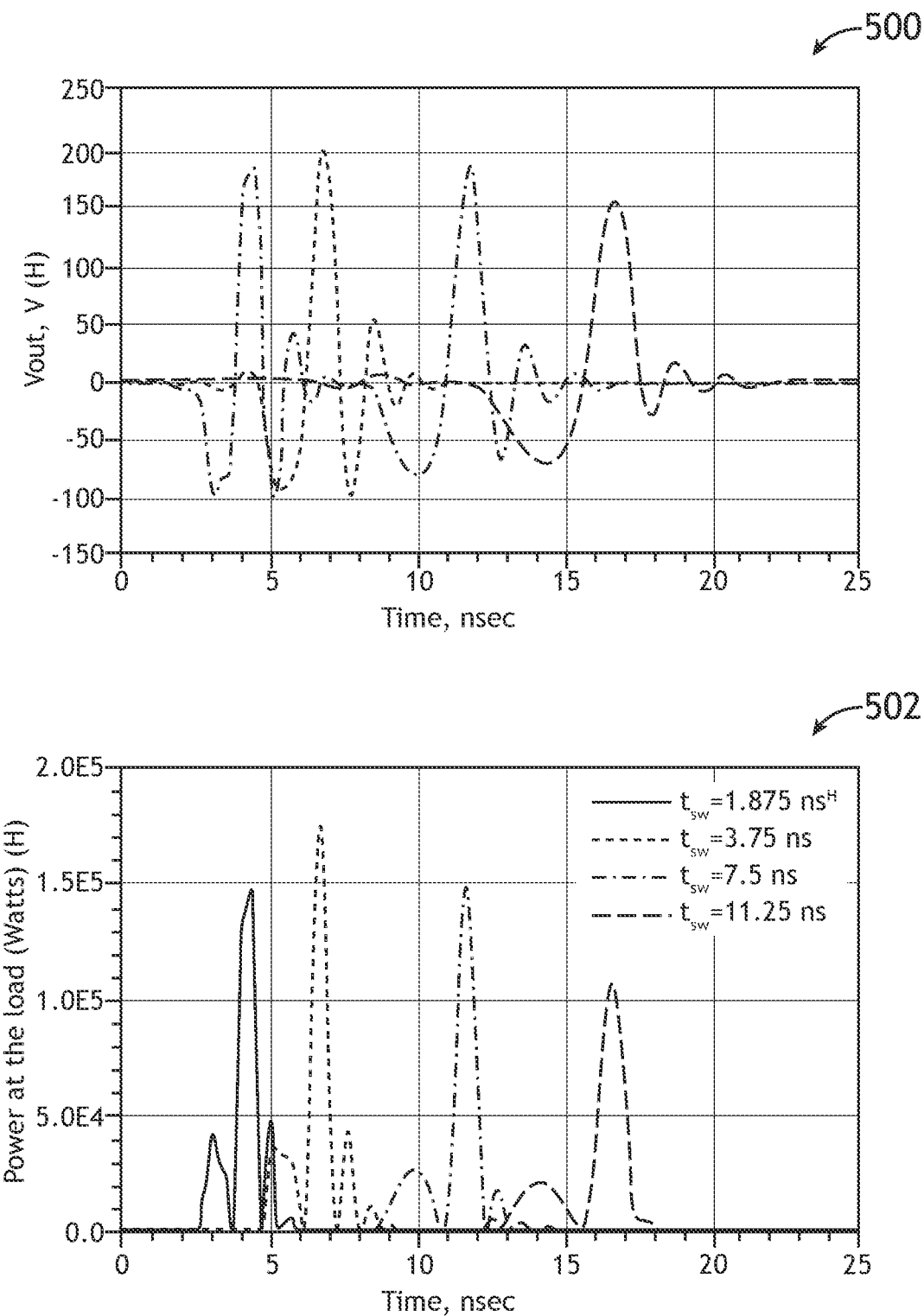
FIG. 5 shows graphs of waveforms for different switching times according to exemplary embodiments.
Figure 5:
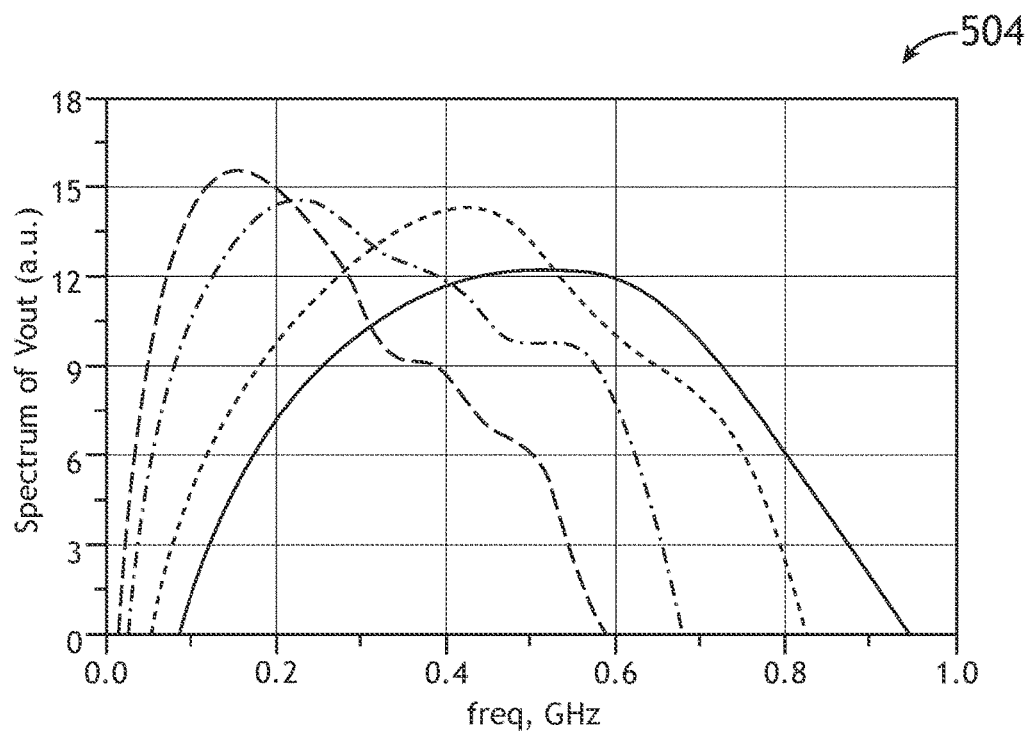

Referring to FIG. 5, graphs of waveforms for different switching times according to exemplary embodiments is shown. Waveforms 500, 502 and their spectra 504 are shown for a minimal delay $t_{delay}$ of 0 ns. Using a short delay allows control over low-frequency pre-pulse. An EMP source circuit may thereby produce moderate and ultra-moderate band pulses. It is also possible to produce multicycle waveforms by adjusting an output impedance.

Figure 6:
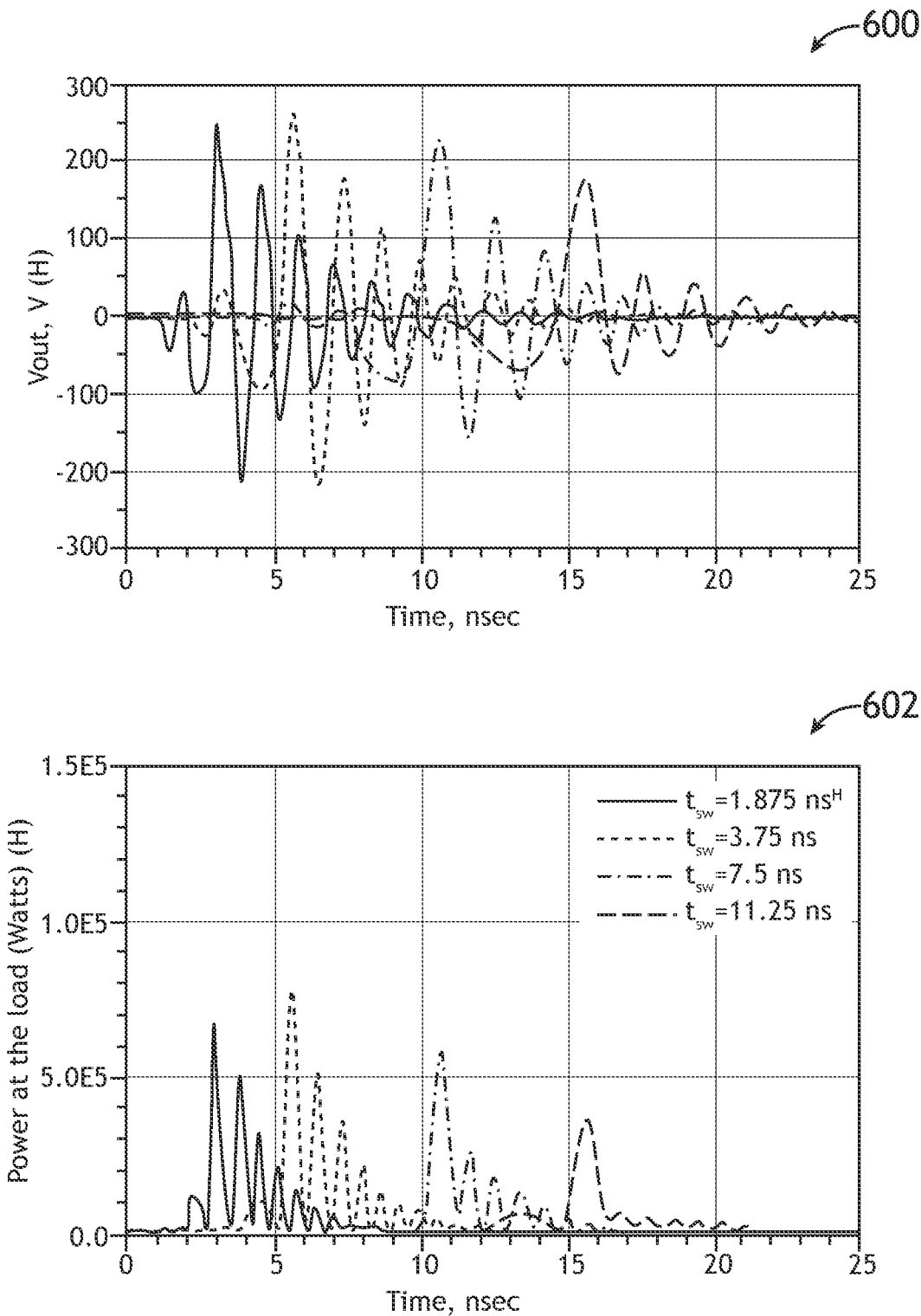
FIG. 6 shows graphs of waveforms for different switching times according to exemplary embodiments.
Figure 6:
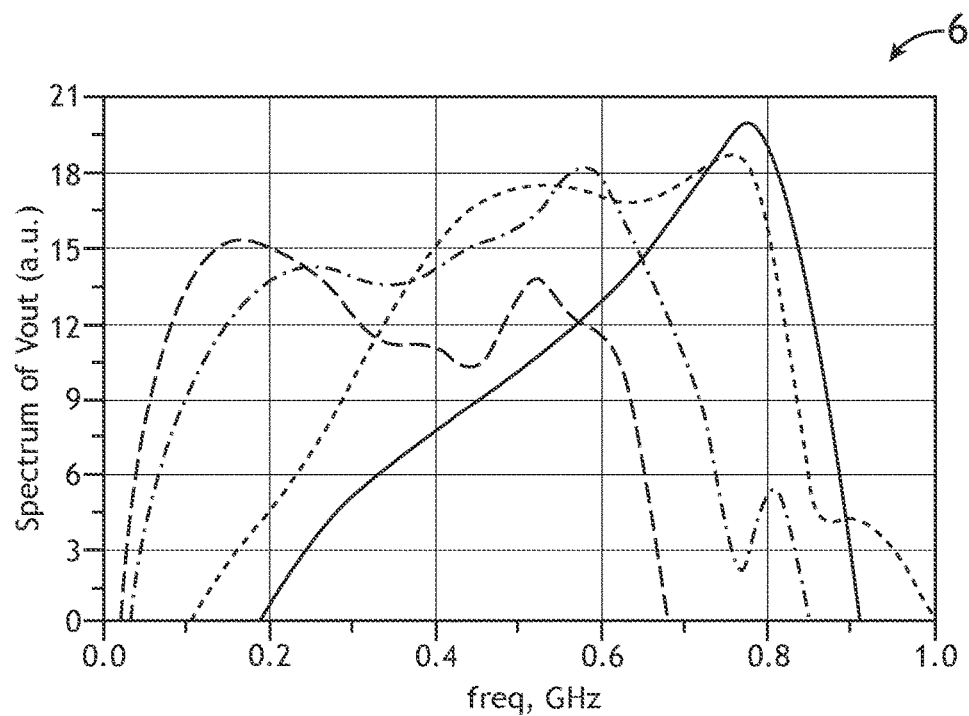

Referring to FIG. 6, graphs of waveforms for different switching times according to exemplary embodiments is shown. Waveforms 600, 602 and their spectra 604 are shown including a load of 1.0 Ohms.

Embodiments of the present disclosure enable a compact, portable EMP source with NLTL functionality that can be implemented based on readily available, fast, high-power switches, and does not require wave propagation though a lossy, nonlinear medium.

The proposed EMP source can be used as a driver, with an input signal up to 1 GHz, for conventional varactor-based or gyromagnetic NLTLs that provide additional pulse sharpening to create frequency content up to 5 GHz. The tunable nature of the EMP source may provide a tunable driver waveform for optimal conventional NLTL performance.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. An electromagnetic pulse (EMP) generator comprising:
 a voltage source; and
 a plurality of switching elements, each comprising:
  an input terminal;
  a first switch;
  a second switch connected in series with the first switch; and
  an output terminal,
 wherein:
  the first switch and the second switch define a shunt switching circuit;
  the voltage source is connected to an input terminal of a first switching element;
  an output terminal of the first switching element is connected to an input terminal of a second switching element;
  a first switch of the first switching element and a first switch of the second switching element are controlled synchronously; and
  a second switch of the first switching element and a second switch of the second switching element are controlled synchronously.

2. The EMP generator of claim 1, wherein each switching element further comprises a linear inductor.

3. The EMP generator of claim 1, further comprising:
 a first trigger signal generator configured to apply a trigger signal to each of the first switch of the plurality of switching elements; and
 a second trigger signal generator configured to apply a trigger signal to each of the second switch of the plurality of switching elements.

4. The EMP generator of claim 3, wherein the first trigger signal generator and second trigger signal generator are configured to operate each first switch and second switch asynchronously.

5. The EMP generator of claim 3, wherein the first trigger signal generator and second trigger signal generator are related by a switching time ($t_{sw}$), an offset time ($t_{offset}$), and a delay time ($t_{delay}$).

6. The EMP generator of claim 5, wherein a spectral content of a resulting EMP is tunable by altering $t_{sw}$, $t_{offset}$, and $t_{delay}$.

7. The EMP generator of claim 1, further comprising an NLTL source, wherein the plurality of switching elements is configured to drive the NLTL source.

8. A method comprising:
 receiving the voltage source by a first switching element in a plurality of switching elements, each comprising a first switch and a second switch, connected in series, that define a shunt switching circuit;
 synchronously switching the first switch of each of the plurality of switching elements;
 synchronously switching the second switch of each of the plurality of switching elements; and
 outputting an EMP from an output terminal of a last switching element,
 wherein the first switches and second switches are operated such that each first switch is in an "on" state when each second switch is in an "off" state.

9. The method of claim 8, further comprising filtering an output signal of each switching element with a linear inductor.

10. The method of claim 8, further comprising operating a first trigger signal generator controlling the state of each first switch and a second trigger signal generator controlling the state of each second switch asynchronously.

11. The method of claim 10, wherein the first trigger signal generator and second trigger signal generator are related by a switching time ($t_{sw}$), an offset time ($t_{offset}$), and a delay time ($t_{delay}$).

12. The method of claim 11, wherein a spectral content of a resulting EMP is tunable by altering $t_{sw}$, $t_{offset}$, and $t_{delay}$.

13. The method of claim 8, driving an NLTL source with the EMP.

14. A circuit comprising:
 a voltage source; and
 a plurality of switching elements, each comprising:
  an input terminal;
  a first switch;
  a second switch connected in series with the first switch; and
  an output terminal, wherein:
the first switch and the second switch define a shunt switching circuit;
the voltage source is connected to an input terminal of a first switching element;
an output terminal of the first switching element is connected to an input terminal of a second switching element;
a first switch of the first switching element and a first switch of the second switching element are controlled synchronously; and
a second switch of the first switching element and a second switch of the second switching element are controlled synchronously.

15. The circuit of claim 14, wherein each switching element further comprises a linear inductor.

16. The circuit of claim 14, further comprising:
a first trigger signal generator configured to apply a trigger signal to each of the first switch of the plurality of switching elements; and
a second trigger signal generator configured to apply a trigger signal to each of the second switch of the plurality of switching elements.

17. The circuit of claim 16, wherein the first trigger signal generator and second trigger signal generator are configured to operate each first switch and second switch asynchronously.

18. The circuit of claim 16, wherein the first trigger signal generator and second trigger signal generator are related by a switching time ($t_{sw}$), an offset time ($t_{offset}$), and a delay time ($t_{delay}$).

19. The circuit of claim 18, wherein a spectral content of a resulting EMP is tunable by altering $t_{sw}$, $t_{offset}$, and $t_{delay}$.

20. The circuit of claim 14, further comprising an NLTL source, wherein the plurality of switching elements is configured to drive the NLTL source.

* * * * *